(12) United States Patent
Yoshida et al.

(10) Patent No.: US 9,049,793 B2
(45) Date of Patent: Jun. 2, 2015

(54) MULTI-PIECE-ARRAY AND METHOD OF MANUFACTURING THE SAME

(75) Inventors: Yoshitaka Yoshida, Nagoya (JP); Hiroaki Yamamoto, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 186 days.

(21) Appl. No.: 13/876,670

(22) PCT Filed: Sep. 30, 2011

(86) PCT No.: PCT/JP2011/072510
§ 371 (c)(1),
(2), (4) Date: Mar. 28, 2013

(87) PCT Pub. No.: WO2012/046640
PCT Pub. Date: Apr. 12, 2012

(65) Prior Publication Data
US 2013/0183475 A1    Jul. 18, 2013

(30) Foreign Application Priority Data

Oct. 8, 2010  (JP) .................. 2010-228039

(51) Int. Cl.
| | | |
|---|---|---|
| *H01K 1/02* | (2006.01) | |
| *H05K 1/03* | (2006.01) | |
| *H05K 3/00* | (2006.01) | |
| *B32B 3/30* | (2006.01) | |

(52) U.S. Cl.
CPC ............ *H05K 1/0306* (2013.01); *Y10T 428/15* (2015.01); *Y10T 156/10* (2015.01); *H05K 3/0052* (2013.01); *H05K 2201/09036* (2013.01); *H05K 2201/0909* (2013.01); *B32B 3/30* (2013.01); *H05K 3/00* (2013.01)

(58) Field of Classification Search
CPC .................. H05K 3/0052; H05K 2201/0909
USPC ............................................. 428/43
See application file for complete search history.

(56) References Cited

FOREIGN PATENT DOCUMENTS

| JP | 62-232187 A | 10/1987 |
|---|---|---|
| JP | 2004-276386 A | 10/2004 |
| JP | 2007-165540 A | 6/2007 |
| JP | 2009-33023 A | 2/2009 |
| JP | 2010-225910 A | 10/2010 |

OTHER PUBLICATIONS

JPO/ISA, International Search Report issued in corresponding international application PCT/JP2011/072510, completed Nov. 20, 2011.

*Primary Examiner* — Alexander Thomas
(74) *Attorney, Agent, or Firm* — Stites & Harbison PLLC; Jeffrey A. Haeberlin

(57) ABSTRACT

A multi-piece-array formed by laminating a plurality of ceramic layers includes: a product region where a plurality of wiring board portions having a rectangular shape in plan view and including cavities are arranged in matrix; a redundant portion that is positioned along a periphery of the product region; and dividing grooves that are formed on a front surface and/or a back surface along a boundary between the wiring board portions and a boundary between the wiring board portion and the redundant portion. A deepest portion of the dividing groove has an arc shape and the dividing groove includes a middle portion, and a width of the deepest portion is greater than a width of the groove inlet and a width of the middle portion is equal to or less than the width of the groove inlet.

8 Claims, 5 Drawing Sheets

MULTI-PIECE-ARRAY AND METHOD OF MANUFACTURING THE SAME

TECHNICAL FIELD

The present invention relates to a multi-piece-array in which it is difficult for chipping, cracking, or breaking to occur from the vicinity of dividing grooves of the wiring hoard at the time the multi-piece-array is divided into individual pieces or before being divided into individual pieces, and which has high reliability, and a method of reliably manufacturing the wiring board.

BACKGROUND ART

When a plurality of ceramic wiring boards are manufactured with multi-piece-array, conventionally, a green sheet laminate body has been formed by laminating and press-bonding a plurality of green sheets where a conductor layer is formed on at least one of a front surface and a back surface of a green sheet laminate body, dividing grooves have been formed so as to have a predetermined depth along boundaries between individual wiring board regions of the laminate body by a blade (die), and a plurality of ceramic wiring boards have been simultaneously manufactured by cutting along the dividing grooves after firing the green sheet laminate body. However, there has been a problem in that the peripheral portions of the wiring board regions adjacent to the blade are deformed by the load of the blade when the blade is made to penetrate the soft green sheet laminate body.

In order to eliminate the deformation of the wiring board regions caused by the blade or jetty portions positioned in the vicinity of the open ends of the dividing grooves, there is proposed a method of manufacturing a ceramic board for division including dividing grooves, which have a substantially V-shaped cross-section and chamfered opening portions and do not include jettys in the vicinity of the open ends, by irradiating (scanning) the surface of a ceramic substrate, which is formed by firing the green sheet laminate body formed by laminating and press-bonding a plurality of green sheets, with a laser beam twice (for example, see PTL 1).

However, in the case of the dividing grooves that have a V-shaped cross-section and are formed by the irradiation of a laser beam as described above, a plurality of microcracks are irregularly generated toward the inside of the ceramic board from the vicinity of the deepest portions of the dividing grooves. As a result, the depth of the dividing groove becomes different from the set depth. For this reason, there has been a problem in that irregular chipping occurs from the vicinity of the dividing grooves in the following the firing step or a plating step subsequent to the firing step or cracking or breaking occurs on the individual wiring boards at the time of division in a dividing step to be further performed.

CITATION LIST

Patent Literature

[PTL 1] JP-A-2004-27638.6 (pages 1 to 7, FIGS. 1 to 4)

SUMMARY OF INVENTION

Technical Problem

The invention has been made to solve the problems described in the background art, and an object of the invention is to provide a multi-piece-array in which it is difficult for chipping, cracking, or breaking to occur from the vicinity of dividing grooves when the multi-piece-array is divided or is not yet divided and which has high reliability, and a method of reliably manufacturing the wiring board.

Solution to Problem

In order to achieve the above-mentioned object, the invention is made from an idea that a laser beam spreads in the green sheet laminate body by fixing the focal point of a laser beam to the vicinity of the surface of a green sheet laminate body when the green sheet laminate body is irradiated with laser multiple times.

That is, a first multi-piece-array of the present invention that is formed by laminating a plurality of ceramic layers and has a front surface and a back surface, the multi-piece-array comprising: a product region where a plurality of wiring board portions having a rectangular shape in plan view and including cavities are arranged in matrix; an edge portion that is positioned along a periphery of the product region; and dividing grooves that are formed on at least one of the front surface and the back surface along a boundary between the wiring board portions and a boundary between the wiring board portion and the edge portion, characterized in that a deepest portion of the dividing groove has an arc shape and the dividing groove includes a middle portion between the deepest portion and a groove inlet on a cross-section orthogonal to an extending direction, and a width of the deepest portion is greater than a width of the groove inlet and a width of the middle portion is equal to or less than the width of the groove inlet.

The present invention includes a second multi-piece-array wherein a radius of the arc shape of the deepest portion of the dividing groove is 6 µm or more. Further, the present invention includes a third multi-piece-array wherein the ceramic layer is made of alumina, mullite, glass-ceramic, or aluminum nitride.

A first method of the present invention of manufacturing a multi-piece-array, the method comprising: forming a green sheet laminate body by laminating and press-bonding a plurality of green sheets, a conductor layer being formed on at least one of a front surface and a back surface of the green sheet laminate body and cavities opened to the front surface of the uppermost layer of the green sheet laminate body being formed at the green sheet laminate body; forming dividing grooves on at least one of the front surface and the back surface of the green sheet laminate body along boundaries between a plurality of wiring board portions, which are arranged in a matrix, and boundaries between the wiring board portion and an edge portion; and firing the green sheet laminate body on which the dividing grooves are formed, wherein the forming of the dividing grooves is performed by irradiating and scanning the green sheet laminate body multiple times with laser of which a focal point is adjusted to the vicinity of the front surface or the back surface of the green sheet laminate body.

The present invention includes a second method of manufacturing a multi-piece-array, wherein the forming of the dividing grooves is performed by irradiating and scanning the front surface and the back surface of the green sheet laminate body multiple times with laser of which a focal point is adjusted to the vicinity of the front surface and the back surface of the green sheet laminate body.

The present invention includes a third method of manufacturing multi-piece-array, wherein the laser used in the forming of the dividing grooves is a YAG laser, a carbon dioxide laser, an excimer laser, a YVO$_4$ laser, a semiconductor laser, or ruby laser.

Meanwhile, the wiring board portion includes a cavity that is opened to the surface, and a seal area on which a lid sealing the cavity is mounted and which is formed on the front surface surrounding the cavity. The wiring board portion includes external connection terminals such as pads formed on the back surface, and an internal wiring layer that is positioned in the wiring board portion. Further, the wiring board portion may include connecting lines for plating that are provided between adjacent wiring board portion or an edge portion and itself.

Furthermore, the cavity includes four sides and a bottom having a rectangular shape in plan view.

Moreover, the dividing groove includes an opening portion that is formed along an exposed ceramic portion or the conductor layer on at least one of the front surface and the back surface.

Further, the depth of the dividing groove is 60% or less of the thickness of the multi-piece-array.

Furthermore, the dividing grooves may be formed only on one of the front surface and the back surface of the multi-piece-array, and any dividing groove may not be formed on the other thereof or the same dividing grooves having a substantially V-shaped cross-section as the dividing grooves in the related art may be formed on the other thereof.

Moreover, the deepest portion of the dividing groove has an arc shape of a semicircular shape or a circular shape including a radius to be described below, on a cross-section orthogonal to the extending direction of the dividing groove.

Further, the groove inlet of the dividing groove means a portion of the dividing groove that is exposed to the surface and interposed between a pair of flat surfaces provided on both sides.

Furthermore, when the depth of the dividing groove is equal to or less than that of the bottom of the cavity, the middle portion of the dividing groove means a portion between the groove inlet and the deepest portion. When the depth of the dividing groove is greater than that of the bottom of the cavity, the middle portion of the dividing groove also includes a portion that is formed between the deepest portion and the groove inlet and is deeper than the bottom of the cavity.

Advantageous Effects of invention

According to the first multi-piece-array, the entire cross-section of the dividing grooves, which are formed on at least one of the front surface and the back surface along the boundaries between the wiring board portions and the boundaries between the wiring board portions and the edge portion and have a lattice shape in plan view, have the shape of a droplet so that the cross-sections of the deepest portions orthogonal to the extending directions of the dividing grooves have an arc shape, each of the dividing grooves includes the middle portion between the deepest portion and the groove inlet, the width of the deepest portion is greater than the width of the groove inlet, and the width of the middle portion is equal to or less than the width of the groove inlet. Accordingly, it is difficult for fine ceramic or metal dust, which is generated by laser irradiation or the like, to reenter the dividing grooves, and the dimensional accuracy of the front surface and the back surface of each wiring board portion can be improved. In addition, unlike the dividing grooves in the related art having a V-shaped cross-section, a plurality of microcracks, which are irregularly formed from the vicinity of the narrowest deepest portions toward the inside, are not formed. As a result, in a firing step or a plating step and at the time of division and the like, it is difficult for chipping, cracking, or breaking to inadvertently occur from the vicinity of the dividing grooves and it is possible to easily cut the multi-piece-array at a predetermined position. Accordingly, it is possible to provide a wiring board that is excellent in shape and dimensional accuracy and has high reliability.

Further, according to the second multi-piece-array, the cross-section of the deepest portion of the dividing groove taken along the horizontal direction has an arc shape having a radius of 6 μm or more. Accordingly, the generation of microcracks in the vicinity of the deepest portion, of the dividing groove in the related art having a substantially V-shaped cross-section does not occur or is significantly suppressed. Therefore, it is difficult for inadvertent chipping, cracking, or breaking to occur from the vicinity of the dividing grooves at the time of division and the like, and it is possible to divide the multi-piece-array into individual pieces by easily cutting the multi-piece-array at a predetermined position. Meanwhile, the radius of the arc shape is preferably 8 μm or more, and more preferably 10 μm or more.

Meanwhile, according to the first manufacturing method, the front surface or the back surface of the green sheet laminate body is irradiated and scanned multiple times along the boundaries between the wiring board portions and the like with a laser of which the focal point is adjusted to the vicinity of the front surface and the back surface. Accordingly, the green sheet laminate body is irradiated with a laser beam so that the laser beam spreads inward of the green sheet laminate body with respect to the front surface and the back surface thereof with a substantially fan shape. Since the energy of the laser grinds and polishes the inner portions of the irradiated green sheets at high temperature, the cross-sections of the deepest portions of the dividing grooves, which are to be formed, orthogonal to the extending direction have an arc shape of a substantially semicircular shape. As a result, unlike the dividing groove in the related art having a substantially V-shaped cross-section, it is possible to prevent or suppress the irregular generation of a plurality of microcracks from the narrowest deepest portion toward the inside. For this reason. It is possible to remove or suppress inadvertent breaking or cracking in the subsequent firing step and the like.

Moreover, since the dividing grooves each of which the width of the deepest portion is greater than the widths of the groove inlet and the middle portions (opening portion) are formed, it is possible to prevent ceramic or metal powder and the like from inadvertently entering the dividing grooves and it is also possible to contribute to the improvement of the dimensional accuracy of the front surface and the back surface of each of the wiring board portions.

Further, according to the second manufacturing method, the green sheet laminate body is irradiated and scanned multiple times with a laser of which the focal point is adjusted to the vicinity of the front surface and the back surface of the green sheet laminate body. It is possible to form the dividing grooves, each of which the cross-section of the deepest portion has an are shape and the width of the deepest portion is greater than the width of the groove inlet and the width of the middle portion (opening portion), on the front surface and the back surface so that the dividing grooves are symmetrical to each other and face each other.

Meanwhile, the green sheet laminate body includes a conductor layer such as a wiring layer that is formed on at least one of the front surface and the back surface thereof, and is formed by laminating and press-bonding two or more green sheets.

Further, virtual planes to be cut are set in advance at the boundaries between the wiring board portions and the boundaries between the wiring board portions and the edge portion on the green sheet laminate body.

Furthermore, the green sheet laminate body is attached to the inside of a rectangular metal frame, and is fixed to the surface of, for example, a movable table together with the metal frame by vacuum adsorption.

Further, the full depth of the dividing groove is 60% or less of the thickness of the green sheet laminate body.

Meanwhile, the number of times of the laser irradiation and scanning at the same position on the same front or the back surface of the green sheet laminate body varies according to the conditions of laser. However, in order to form a dividing groove having a commonly-used depth on a green sheet, it is preferable that laser irradiation be continuously performed at least two times, preferably, about three to seven times.

DESCRIPTION OF EMBODIMENTS

Embodiments of the invention will be described below.

Figure 1:
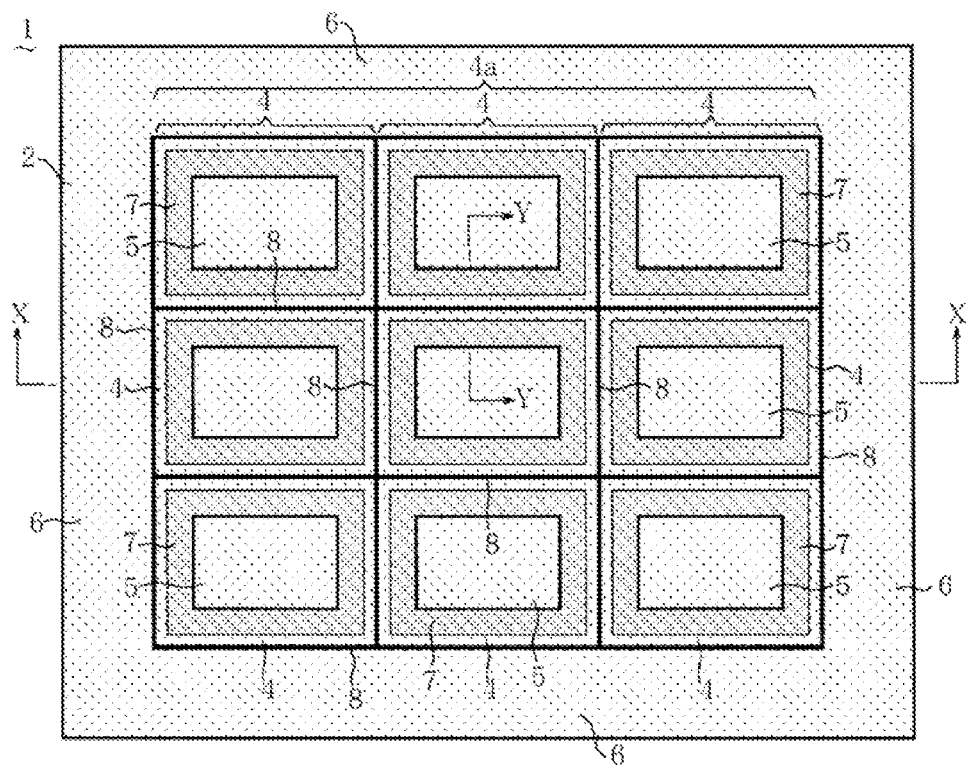
FIG. 1 is a plan view of a multi-piece-array according to an embodiment of the invention.
Figure 2:
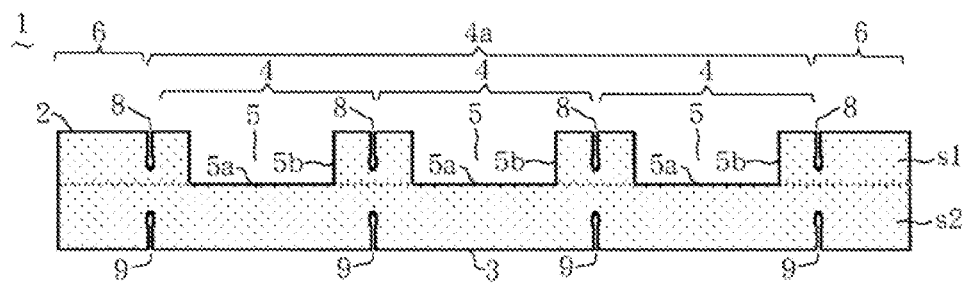
FIG. 2 is a vertical cross-sectional view taken, along line X-X of FIG. 1.
Figure 3:
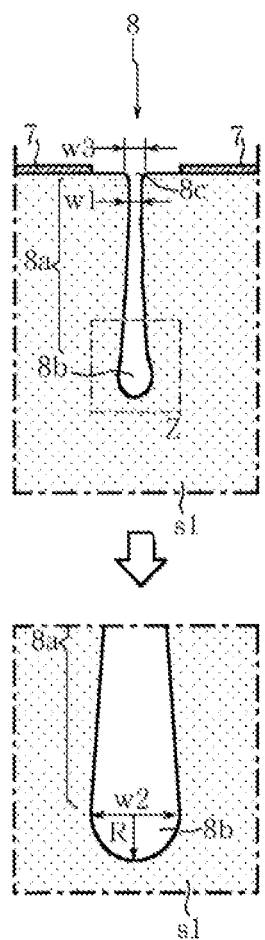
FIG. 3 is a partially enlarged cross-sectional view taken along line Y-Y of FIG. 1.

FIG. 1 is a plan view of a multi-piece-array 1 according to an embodiment of the invention. FIG. 2 is a vertical cross-sectional view taken along line X-X of FIG. 1, and FIG. 3 is a partially enlarged cross-sectional view taken along line Y-Y of FIG. 1 and a partially enlarged view of a portion Z shown in FIG. 3 by a dashed-dotted line.

As shown in FIGS. 1 and 2, the multi-piece-array 1 is formed by laminating upper and lower, that is, two (a plurality of) ceramic layers s1 and s2 made of, for example, alumina (ceramic), and has a front surface (main surface) 2 and a back surface (main surface) 3 that have a rectangular shape in plan view. Further, the multi-piece-array 1 includes a product region 4a where a plurality of wiring board portions 4 having a rectangular shape in plan view are arranged in a matrix, an edge portion 6 that has the shape of a rectangular frame and is positioned along the periphery of the product region 4a, and dividing grooves 8 and 9 that are symmetrically formed on the front surface 2 and the back surface 3 along boundaries between the adjacent wiring board portions 4 and 4 and boundaries between the wiring board portions 4 and the edge portion 6.

Meanwhile, the front surface 2 and the back surface 3 are common to the multi-piece-array 1, the wiring board portions 4, and the edge portion 6.

The wiring board portion 4 includes a cavity 5 that is opened to the front surface 2 and includes four sides 5b and a bottom 5a having a rectangular shape in plan view. A seal area, which has a predetermined width and a rectangular shape in plan view, is positioned on the front surface 2 around the opening portion of the cavity 5, and a sealing conductor layer 7 is formed on the seal area. Meanwhile, a pad, which is electrically connected to electronic components to be mounted, is formed on the bottom 5a of the cavity 5, via conductors penetrating the lower ceramic layer are formed at the lower ceramic layer s2, and external connection terminals (none of which are shown) are formed on the back surface 3 of the wiring board portion 4. The conductor layer 7, the pad, and the like are made of W or Mo.

As shown in FIG. 2, the entire dividing grooves 8 and 9 have the shape of a droplet on the cross-section orthogonal to an extending direction. As exemplified by the dividing groove 8 of FIG. 3, the deepest portion 8b includes a middle portion (opening portion) 8a between the deepest portion 8b and a groove inlet 8c on a cross-section having an arc shape including a substantially semicircular shape. A width w2 of the deepest portion 8b is greater than a width w3 of the groove inlet 8c, and a width w1 of the middle portion 8a is equal to or less than the width w3 of the groove inlet 8c (w2>w3≥w1). A radius R of the deepest portion 8b is 6 μm or more. Microcracks, which are formed toward the inside of the ceramic layers, are not formed or only a very small number of short microcracks are formed on the inner wall surface, which has a substantially semicircular cross-section, of the deepest portion 8b. This is caused by a dividing groove forming step using laser irradiation to be described below.

As shown in FIG. 2, the dividing grooves 8 and 9 face each other with postures that are symmetrical in the thickness directions of the front surface 2 and the back surface 3 of the multi-piece-array 1, and the full depths of the dividing grooves 8 and 9 are about 60% of the thicknesses of the front surface 2 and the back surface 3. Meanwhile, the deepest portion 8b (depth) of the dividing groove 8 is formed at a position shallower than the bottom 5a of the cavity 5.

According to the above-mentioned multi-piece-array 1, the cross-sections of the deepest portions 8b of the dividing grooves 8 and 9, which are symmetrically formed on the front surface 2 and the back surface 3 along the boundaries between the wiring board portions 4 and 4 and the boundaries between the wiring board portions 4 and the edge portion 6 and have a lattice shape in plan view, have an arc shape, the width w2 of the deepest portion 8b is greater than the width w3 of the groove inlet 8c, and the width w1 of the middle portion 8a is equal to or less than the width w3 of the groove inlet 8c. Accordingly, unlike dividing grooves in the related art, a plurality of microcracks is not irregularly formed toward the inside of ceramic layers from the vicinity of the deepest portion that has a substantially V-shaped cross-section and is narrow.

For this reason, in a firing step or a plating step at the time of manufacture and at the time of division, it is difficult for inadvertent chipping, cracking, or breaking to occur from the vicinity of the dividing grooves 8 and 9 and it is possible to easily cut the multi-piece-array at a predetermined position.

Moreover, since the width w3 of the groove inlet 8c is less than the width w2 of the deepest portion 8b, it is possible to make the width of the seal area, which is positioned on the front surface 2 surrounding the cavity 5 of each of the wiring board portions 4, large. Accordingly, it is possible to easily form the conductor layer 7, which has high sealing performance, on the area. Therefore, the multi-piece-array is excellent in shape and dimensional accuracy and has high reliability.

A method of manufacturing the multi-piece-array 1 will be described below.

Ceramic slurry, which has been obtained in advance by mixing alumina powder, a binder resin, a solvent, and the like, is formed in the shape of a sheet, so that two green sheets g1 and g2 are obtained. Via holes, which are formed in the green sheet g2, which will form a lower layer, are filled with conductive paste containing W powder, and the same conductive paste as described above is formed on at least one of the front surface and the back surface of each of the green sheets g1 and g2 by printing. Next, after through holes, which have a rectangular shape in plan view, are formed in the green sheet g1 forming art upper layer by punching, a green sheet laminate body gs is obtained by laminating and press-bonding the green sheets g1 and g2.

After that, the green sheet laminate body gs is held on the surface of a table (not shown), which moves in longitudinal and lateral directions in plan view, by vacuum adsorption. As shown on the left side in FIG. 4, a laser irradiation head 10 of which an axial direction is vertical is disposed above the table so as to be capable of moving up and down. Meanwhile, reference numeral 5 of FIG. 4 denotes a part of the through hole that will form a cavity and is formed in the green sheet g1.

Figure 4:
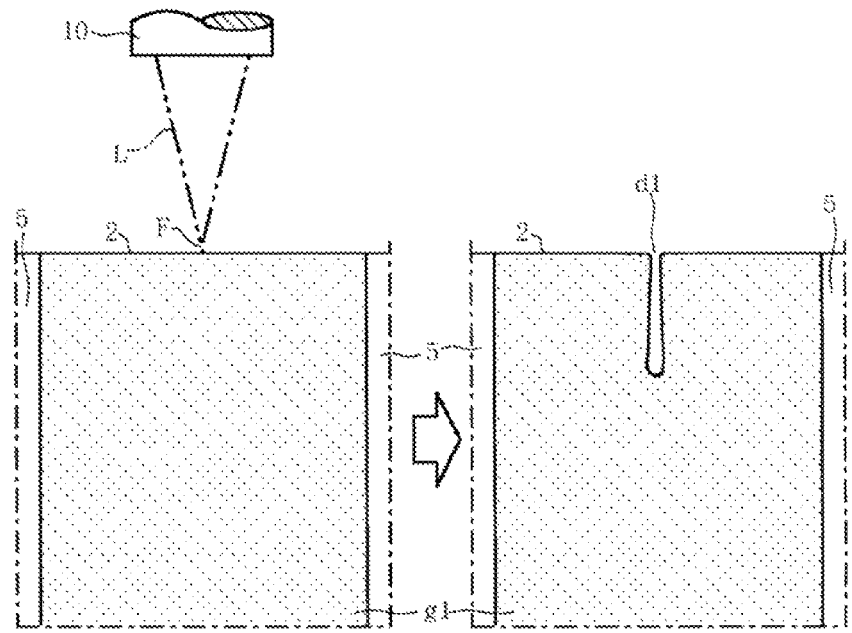
FIG. 4 is a partially enlarged view illustrating a dividing groove forming step for the multi-piece-array according to the invention.

By moving the green sheet laminate body gs in a horizontal direction together with the table in such a state, as shown on the left side in FIG. 4, the front surface 2 of the green sheet g1, that is, the upper layer of the green sheet laminate body gs is irradiated along portions between the wiring board portions 4 and 4 or the boundaries between the wiring board portions 4 and the edge portion 6 with laser L from the head 10. The laser L is, for example, $YVO_4$ laser, and a focal point F of the laser is positioned in the vicinity of the front surface 2 of the green sheet g1. Meanwhile, the laser L may be a YAG laser, a carbon dioxide laser, an excimer laser, a semiconductor laser, a ruby laser, or the like.

As a result, as shown, on the right side in FIG. 4, a small groove d1, which has a substantially U-shaped cross-section orthogonal to the extending direction along the front surface 2 of the green sheet g1, is formed along the boundaries.

Figure 5:
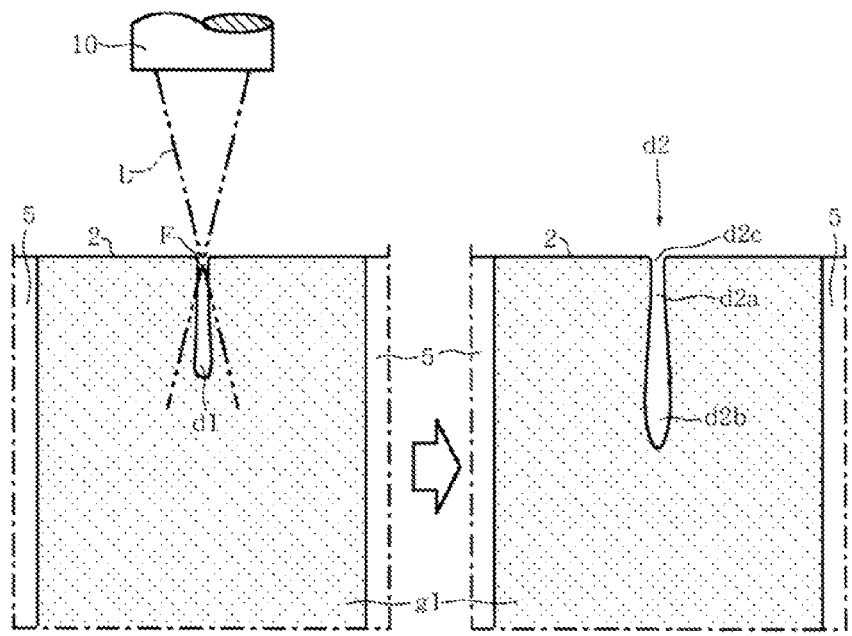
FIG. 5 is a partially enlarged view illustrating the dividing groove forming step following FIG. 4.

After that, as shown on the left side in FIG. 5, the green sheet is irradiated with the laser L along the small groove d1 in the same way as described above while the focal point F is positioned in the vicinity of the front surface 2 of the green sheet g1. As shown in FIG. 5 by a two-dot chain line, the laser L spread in the green sheet g1 in a substantially conical shape after being focused at the focal point F in the vicinity of the front surface 2. As a result, as shown on the right side in FIG. 5, a middle groove d2, where the position of the deepest portion d2b is deeper than the small groove d1 and the width of the deepest portion d2b is greater than the width of an opening portion d2a, is formed along the small groove d1.

Figure 6:
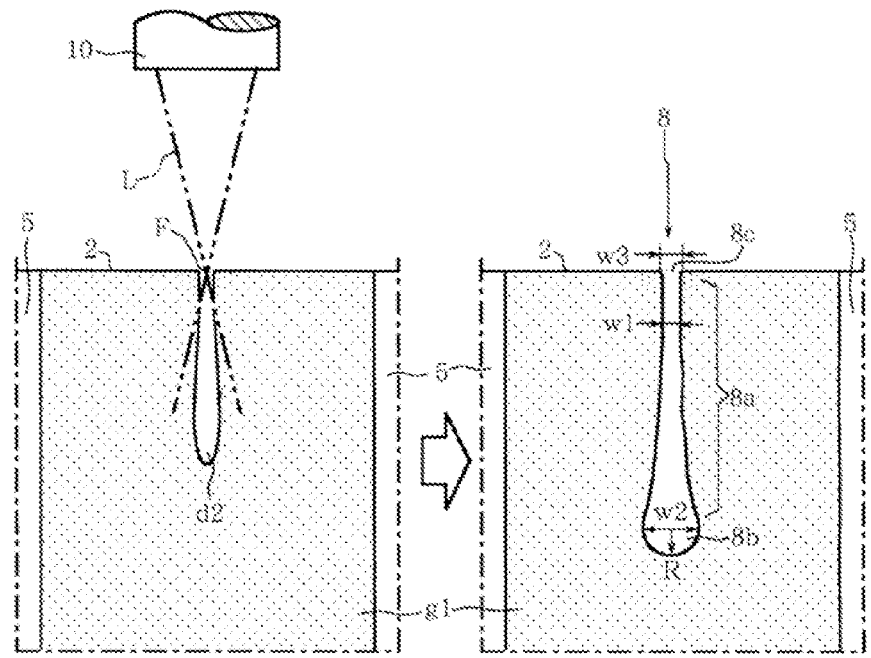
FIG. 6 is an enlarged view illustrating the dividing groove forming step following FIG. 5 and is a cross-sectional view of the obtained dividing groove.

Further, as shown on the left, side in FIG. 6, the green sheet is irradiated with the laser L alone the middle groove d2 in the same way as described above while the focal point F is positioned in the vicinity of the front surface 2 of the green sheet g1. The laser L also spread in the green sheet g1 in a substantially conical shape after being focused at the focal point F in the vicinity of the front surface 2. As a result, as shown on the right side in FIG. 6, the dividing groove 8, where the position of the deepest portion 8b is deeper than the deepest portion d2b of the middle groove d2 and the width w2 of the deepest portion 8b is greater than the width w3 of the groove inlet 8c or the width w1 of the middle portion (opening portion) 8a, is formed along the middle groove d2. Meanwhile, the width w1 of the middle portion 8a is equal to or less than the width w3 of the groove inlet 8c.

Meanwhile, the dividing groove 8 can be formed so as to have a desired depth and the cross-sectional shapes and dimensions of the deepest portion 8b and the middle portion 8a by irradiating the green sheet g1 with the laser 1 the same number of times so that the green sheet is irradiated with the laser L at least three times.

Moreover, the same position on the front surface 2 of the green sheet g1 of which the thickness is 400 μm and the feeding speed is 160 mm/sec is scanned and irradiated five times of reciprocation with $YVO_4$ laser of 50 Hz and an power of 5 W while the focal point of the $YVO_4$ laser is adjusted to the front surface 2 of the green sheet g1.

As a result, it is possible to continuously form the dividing groove (8) including the deepest portion (8b), of which the cross-section orthogonal, to the extending direction had an arc shape, the depth is about 290 μm, and the width (w2) is greater than the width (w3) of the groove inlet (8c) (about 30 μm) and the width (w1) of the middle portion 8a (about 20 μm), along the front surface 2 of the green sheet g1.

Figure 7:
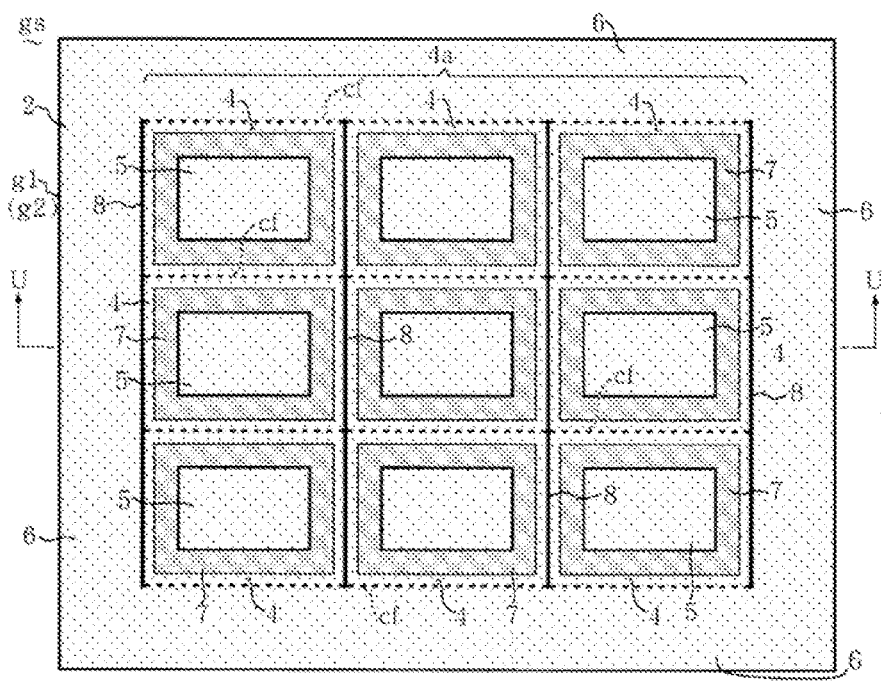
FIG. 7 is a plan view of a green sheet laminate body in the dividing groove forming step.
Figure 8:
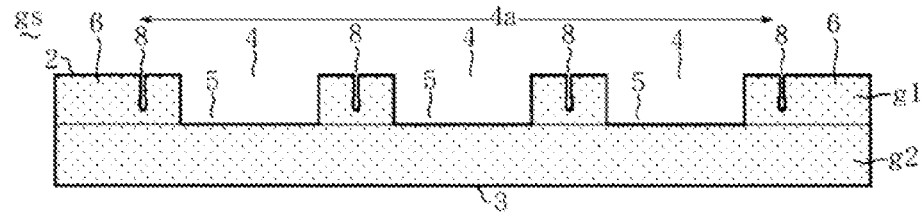
FIG. 8 is a vertical cross-sectional view taken along line U-U of FIG. 7.

By a step of forming the dividing groove 8 using the irradiation of the laser L, as shown in a plan view of the green sheet laminate body gs shown in FIG. 7 and FIG. 8 of a vertical cross-sectional view taken along line U-U of FIG. 7, a plurality of dividing grooves 8, which are orthogonal to the extending direction and included the deepest portions 8b having an arc-shaped cross-section, the middle portions 8a, and the groove inlets 8c, are formed parallel to each other at the front surface 2 of the laminate body gs along the longitudinal (Y) direction of the boundaries between the wiring board portions 4 and 4 and the boundaries between the wiring board portions 4 and the edge portion 6. Meanwhile, broken lines, in FIG. 7 are virtual planes (boundaries) cf to be cut that are set along the boundaries.

Subsequently, by a step of forming the dividing groove 8 using the irradiation of the same laser L as described above, a plurality of dividing grooves 8, which included the deepest portions 8b having an arc-shaped cross-section, the middle portions 8a, and the groove inlets 8c, are formed parallel to each other on the front surface 2 of the laminate gs along the lateral (X) direction of the boundaries between the wiring board portions 4 and 4 and the boundaries between the wiring board portions 4 and the edge portion 6. As a result, the dividing grooves 8 having a lattice shape in plan view (the same as in FIG. 1) are obtained.

Figure 9:
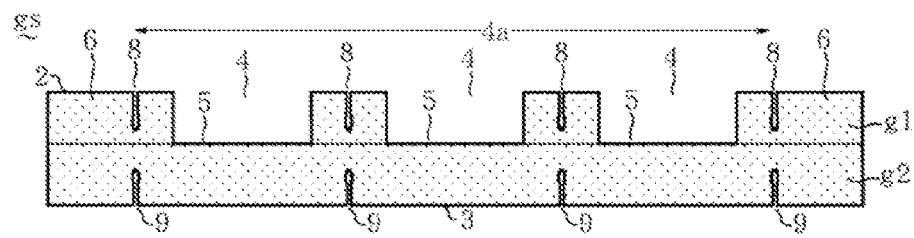
FIG. 9 is a vertical cross-sectional view similar to FIG. 8 showing the laminate body on which the dividing groove forming step has been finished.

Further, as shown in FIG. 9, a plurality of dividing grooves 9, which have a lattice shape in plan view, are formed even on the back surface 3 of the green sheet laminate body gs so as to be symmetrical to the dividing grooves 8 by performing a step of irradiating the green sheet with the same laser L as described above.

After that, the green sheet laminate body gs on which the dividing grooves 8 and 9 are formed is fired in a predetermined temperature range. As a result, the multi-piece-array 1 including the ceramic layers s1 and s2, which are the fired green sheets g1 and g2, is obtained as shown in FIGS. 1 and 2. Further, finally, the surface of the conductor layer 7 or the like of the multi-piece-array 1 is covered with Ni and Au plating films (none of which are shown) by electrodes for plating (not shown) that are separately formed on the side of the edge portion 6 or by electroless plating.

According to the method of manufacturing the above-mentioned multi-piece-array 1, the green sheet laminate body is irradiated and scanned multiple times along the boundaries between the wiring board portions 4 and 4 and the like on the front surface 2 and the back, surface 3 of the green sheet laminate body gs with laser of which the focal point F is adjusted to the vicinity of the front surface 2 and the back surface 3 thereof. Accordingly, the green sheet laminate body is irradiated with the laser L so that the laser spread in a substantially cortical shape (fan shape) in the portions of the green sheet laminate body inside the front surface 2 and the back surface 3. As a result, the energy of the laser L grinds and polishes the inner portions of the irradiated green sheets g1 and g2 at high temperature. For this reason, the cross-sections of the deepest portions 8b (9b) of the dividing grooves 8 and 9, which are to be formed, orthogonal to the extending direction, have an arc shape of a substantially semicircular shape, the width w2 of the deepest portion 8b (9b) is wider than the width w3 of the groove inlet 8c (9c), and the width w1 of the middle portion 8a (9a) is equal to or less than the width w3 of the groove inlet 8c (9c). As a result, unlike the dividing groove in the related art having a substantially V-shaped cross-section, it is possible to prevent or suppress the irregular generation of a plurality of microcracks from the narrowest deepest portion. Accordingly, it is possible to suppress inadvertent breaking or cracking in the following firing step and the like.

Further, since the dividing grooves 8 and 9 each of which the width w2 of the deepest portion 8b is greater than the width w3 of the groove inlet 8c and the width w1 of the middle portion 8a are formed, it is possible to prevent ceramic or metal powder and the like from inadvertently reentering the dividing grooves, to improve the dimensional accuracy of the front surface 2 and the back surface 3 of each of the wiring board portions 4, and to easily secure a seal area having a required width on each of the surfaces 2 of the wiring board portions 4.

Figure 10:
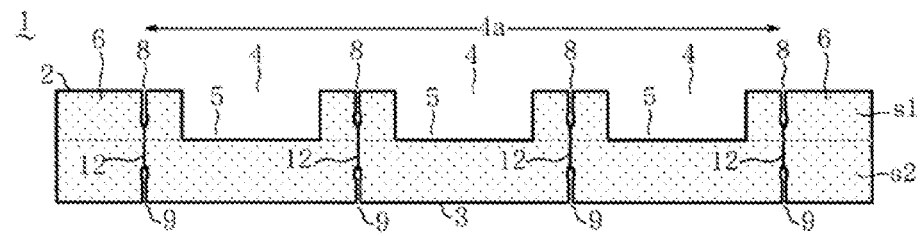
FIG. 10 is a vertical cross-sectional view of the multi-piece-array that is obtained from the invention.

Furthermore, as shown in FIG. 10, the full depths of the dividing grooves 8 and 9 of the front surface 2 and the back surface 3 are about 60% of the full thickness and the deepest portions 8b and 9b having arc-shaped cross-sections are close to each other. Accordingly, when the multi-piece-array is divided into individual pieces, it is possible to divide the wiring boards 4 and 4 at cutting planes 12, which connect the deepest portions at the shortest distance, with high dimensional accuracy.

Figure 11:
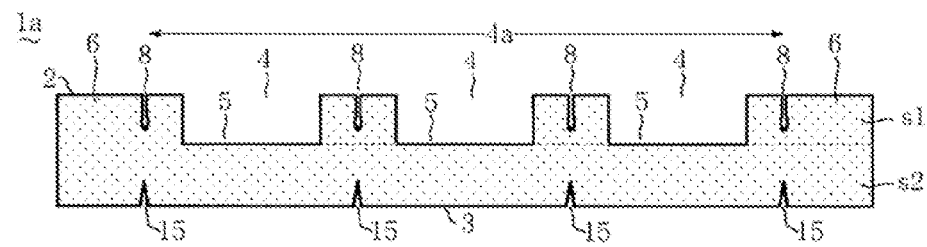
FIG. 11 is a vertical cross-sectional view of a multi-piece-array according to another embodiment.

FIG. 11 is a cross-sectional view of a multi-piece-array 1a according to another embodiment.

As shown in FIG. 11, the same dividing grooves 8 as described above are formed in a matrix in a lattice shape on a front surface 2 of the multi-piece-array 1a along portions between the wiring board portions 4 and 4 and the boundaries between the wiring board portions 4 and an edge portion 6, but the dividing grooves 15 in the related art having a substantially V-shaped cross-section are formed in a matrix in a lattice shape along the boundaries of the back surface 3 of the multi-piece-array. Meanwhile, it is possible to form the dividing grooves 15 by scanning the back surface with laser multiple times so that the position of the focal point becomes gradually deeper without changing the distance of the focal point F of the laser.

Since the generation of microcracks on the deepest portions 8b of the same dividing grooves 8 as described above, which are formed on the front surface 2, is suppressed as described above even by the multi-piece-array 1a, it is possible to suppress inadvertent breaking or cracking after the firing step or in a dividing step.

Figure 12:
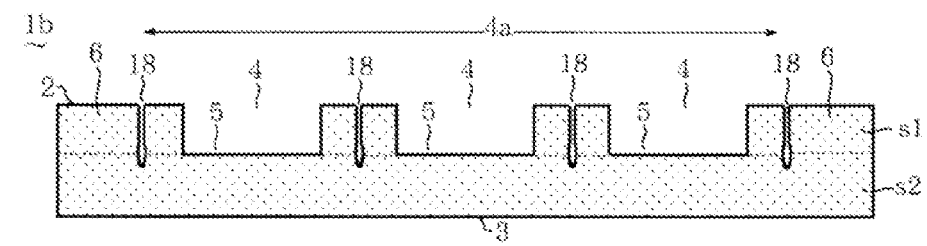
FIG. 12 is a vertical cross-sectional view of a multi-piece-array according to still another embodiment.

FIG. 12 is a cross-sectional view of a multi-piece-array 1b according to still another embodiment.

As shown in FIG. 12, dividing grooves 18, which have the same cross-sectional shapes as the cross-sectional shapes of the above-mentioned dividing grooves 8 and include the deepest portions deeper than the bottoms of cavities 5, are formed in a matrix in a lattice shape on a front surface 2 of the multi-piece-array 1b along portions between the wiring board portions 4 and 4 and the boundaries between the wiring board portions 4 and an edge portion 6, but dividing grooves are not formed on the back surface 3 of the multi-piece-array. The depth of the dividing groove 18 is in the range of about 50% to 55% of the thickness of the wiring board 1b. Since the generation of microcracks on the dividing grooves 18, which are formed only on the front surface 2 and are relatively deep, is suppressed as described above even by the multi-piece-array 1b, it is possible to suppress inadvertent breaking or cracking after the firing step or in a dividing step. Further, since the deepest portion of the dividing groove 18 is formed at a position deeper than the bottom of the cavity 5, the thicknesses of four side walls surrounding the cavity 5 are relatively uniform and strong.

The invention is not limited to the above-mentioned embodiments.

For example, the ceramic layers s1 and s2 may be made of low-temperature fired ceramic such as glass-ceramic. In this case, Cu or Ag is used as a conductor such as the conductor layer 5.

Further, the multi-piece-array or the wiring board portion may have a square shape in plan view.

Furthermore, the multi-piece-array may include three or more ceramic layers, and the green sheet laminate body may also be obtained by laminating and press-bonding three or more green sheets.

Moreover, electrodes for electrolytic plating may be formed on the side of the groove and connecting lines for plating may be formed between the electrode and each of the wiring board portions 4 or between the wiring board portions 4 and 4. In this embodiment, the dividing grooves 8, 9, and 18 are formed so as to have a depth where the connecting lines for plating are not exposed to the outside.

In addition, the laser irradiation head 10 may include auto focus means or a focal point maintaining mechanism that always fixes the focal point F of emitted laser L in the vicinity of the surface of the green sheet laminate body.

INDUSTRIAL APPLICABILITY

According to the multi-piece-array of the invention, it is difficult for chipping, cracking, or breaking to occur from the vicinity of the dividing grooves when the multi-piece-array is divided into individual wiring boards or is not yet divided into individual wiring boards. Accordingly, it is possible to obtain high reliability.

REFERENCE SIGNS LIST 1, 1a, 1b: multi-piece-array
2: front surface
3: back surface
4: wiring board portion
4a: product region
5: cavity
6: edge portion
7; conductor layer 8, 9, 18: dividing groove
8a: middle portion
8b: deepest portion
8c: groove inlet
g1, g2: green sheet
gs: green sheet laminate body
s1, s2: ceramic layer
L: laser
F: focal point
w1, w2: width
R: radius
cf: plane to be cut (boundary)

The invention claimed is:

1. A multi-piece-array that is formed by laminating a plurality of ceramic layers and has a front surface and a back surface, the multi-piece-array comprising:
   a product region where a plurality of wiring board portions having a rectangular shape in plan view and including cavities are arranged in matrix;
   an edge portion that is positioned along a periphery of the product region; and
   dividing grooves that are formed on at least one of the front surface and the back surface along a boundary between the wiring board portions and a boundary between the wiring board portion and the edge portion,
   wherein a deepest portion of the dividing groove has an arc shape and the dividing groove includes a middle portion between the deepest portion and a groove inlet on a cross-section orthogonal to an extending direction of the dividing groove, and
   wherein a width of the deepest portion is greater than a width of the groove inlet and a width of the middle portion is equal to or less than the width of the groove inlet.

2. The multi-piece-array according to claim 1, wherein a radius of the arc shape of the deepest portion of the dividing groove is 6 μm or more.

3. The multi-piece-array according to claim 1, wherein the ceramic layer is made of alumina, mullite, glass-ceramic, or aluminum nitride.

4. A method of manufacturing the multi-piece-array of claim 1, the method comprising:
   forming a green sheet laminate body by laminating and press-bonding a plurality of green sheets, a conductor layer being formed on at least one of a front surface and a back surface of the green sheet laminate body and cavities opened to the front surface of the uppermost layer of the green sheet laminate body being formed at the green sheet laminate;
   irradiating and scanning the green sheet laminate body multiple times with a laser of which a focal point is adjusted to the vicinity of the front surface or the back surface of the green sheet laminate body to form the dividing grooves on at least one of the front surface and the back surface of the green sheet laminate body along the boundary between the plurality of wiring board portions, which are arranged in matrix, and the boundary between the wiring board portion and the edge portion; and
   firing the green sheet laminate body on which the dividing grooves are formed.

5. The method according to claim 4, wherein the front surface and the back surface of the green sheet laminate body are irradiated and scanned multiple times with the laser, respectively.

6. The method according to claim 4, wherein the laser used in the forming of the dividing grooves is a YAG laser, a carbon dioxide laser, an excimer laser, a $YVO_4$ laser, a semiconductor laser, or ruby laser.

7. The method according to claim 4, wherein
   a deepest portion of the dividing groove has an arc shape and the dividing groove includes a middle portion between the deepest portion and a groove inlet on a cross-section orthogonal to an extending direction of the dividing groove, and
   a width of the deepest portion is greater than a width of the groove inlet and a width of the middle portion is equal to or less than the width of the groove inlet.

8. The method according to claim 4, wherein a radius of the arc shape of the deepest portion of the dividing groove is 6 μm or more.

* * * * *